United States Patent [19]

Mizutani

[11] Patent Number: 5,528,027
[45] Date of Patent: Jun. 18, 1996

[54] SCANNING EXPOSURE APPARATUS HAVING A SCANNING DEVICE FOR SCANNING LIGHT BEAMS ALONG THE MOVEMENT DIRECTION OF A MOVING MASK STAGE

[75] Inventor: Hideo Mizutani, Yokohama, Japan

[73] Assignee: Nikon Corporation, Japan

[21] Appl. No.: 463,567

[22] Filed: Jun. 5, 1995

Related U.S. Application Data

[63] Continuation of Ser. No. 264,664, Jun. 23, 1994, abandoned.

[30] Foreign Application Priority Data

Jun. 23, 1993 [JP] Japan .................................. 5-151862

[51] Int. Cl.$^6$ ..................................................... H01J 3/14
[52] U.S. Cl. .......................... 250/234; 250/548; 356/400
[58] Field of Search .................................. 250/234, 548, 250/557; 356/399, 400, 401, 393, 398; 355/53, 55, 64; 219/121.82, 121.83, 121.85

[56] References Cited

U.S. PATENT DOCUMENTS 4,822,975  4/1989  Toriqoe ............................. 219/121.85
5,194,893  3/1993  Nishi ......................................... 355/53

*Primary Examiner*—Edward P. Westin
*Assistant Examiner*—Que T. Le
*Attorney, Agent, or Firm*—Pennie & Edmonds

[57] ABSTRACT

A scanning exposure apparatus according to the present invention comprises a reticle stage for continuously moving a reticle and a wafer stage for moving a wafer in synchronization with the movement of reticle. A light supply system emits light beams for detecting a relative positional relation between the reticle stage and the wafer stage toward the reticle. On this occasion the emitted light beams are scanned to follow the moving reticle stage, using for example a galvanometer scanner.

17 Claims, 8 Drawing Sheets

SCANNING EXPOSURE APPARATUS HAVING A SCANNING DEVICE FOR SCANNING LIGHT BEAMS ALONG THE MOVEMENT DIRECTION OF A MOVING MASK STAGE

This is a continuation of application Ser. No. 08/264,664, filed Jun. 23, 1994, now abandoned.

BACKGROUND OF THE INVENTION

1. Field of the Invention

The present invention relates to a scanning exposure apparatus of a projection type, which performs projection exposure of an original pattern on a photomask onto a photosensitive substrate while moving both the photomask and the photosensitive substrate at a time.

2. Related Background Art

In fabricating semiconductor devices, liquid crystal display devices or thin-film magnetic heads by the photolithography technology, projection exposure apparatus have been used to perform exposure of an original pattern on a photomask or reticle onto a substrate such as a wafer or a glass plate coated for example with a photoresist through a projection optical system. Recently, a chip pattern for semiconductor devices tends to increase its size and therefore the projection exposure apparatus are required to increase the exposure area to transfer a larger area on the reticle onto the photosensitive substrate.

Then, there are developed projection exposure apparatus of a so-called slit scan exposure method, which successively transfer segments of a pattern on a reticle onto a substrate while moving the reticle and the photosensitive substrate in synchronization, forming an illumination area for example of a rectangle, an arc or a hexagon (as will be referred to as "slit illumination area"). Such projection exposure apparatus are provided with an alignment apparatus for performing positioning (alignment) between each shot area and the reticle from a positional relation between an alignment mark (wafer mark) for each shot area on the substrate and an alignment mark (reticle mark) on the reticle (Japanese Laid-open Patent Application No. 4-307720).

Also, U.S. Pat. No. 4,301,363 discloses such a technology that alignment light is scanned to the alignment mark using a polygon mirror.

SUMMARY OF THE INVENTION

It is an object of the present invention to provide a scanning exposure apparatus which is suitable for relative alignment between a photomask and a photosensitive substrate even in a state that during exposure the photomask and the photosensitive substrate are sequentially moved relative to each other.

The above and other objects will be further apparent from the following description.

The present invention provides a scanning exposure apparatus, which continuously transfers segments of an original pattern formed on a photomask, onto a photosensitive substrate to transfer an image of the entire original pattern on the photosensitive substrate, comprising a mask stage for moving the photomask in a predetermined direction, a substrate stage for moving the photosensitive substrate along the moving direction of the mask stage, driving means for driving the mask stage and substrate stage, a light supply system for emitting light beams for detecting a relative positional relation between the mask stage and the substrate stage, scanning means for scanning the light beams emitted from the light supply system along the moving direction of the mask stage so as to follow the moving mask stage, and a light-receiving system for detecting reflected light of the light beams emitted from the light supply system.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Preferred embodiments of the present invention will be described with reference to the accompanying drawings.

Figure 1:
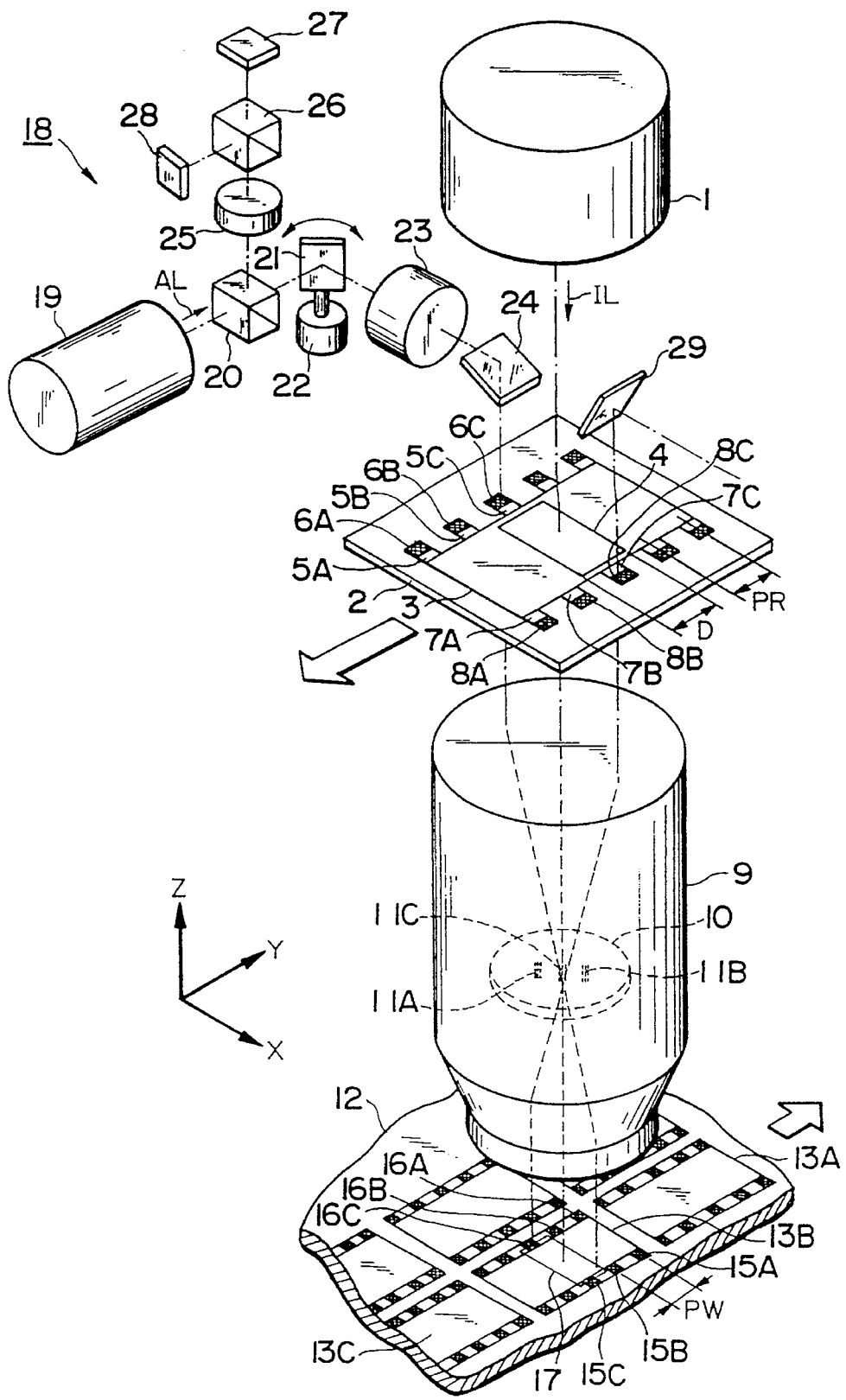
FIG. 1 is a perspective view to show the scheme of a scanning exposure apparatus according to the present invention.

FIG. 1 shows the main part of a scanning exposure apparatus according to the present embodiment. A part of original pattern area 3 on a reticle (photomask) 2 is illuminated by exposure light IL emitted from an illumination optical system 1, whereby a rectangular illumination area 4 is formed on the original pattern area 3 as illuminated with uniform illuminance. The exposure light IL is a pulse laser beam (of wavelength 248 nm) of KrF excimer laser or the i line (of wavelength 365 nm) of mercury lamp, for example. A coordinate system is taken such that the X axis and the Y axis are defined on a plane parallel to the reticle 2 and the Y direction (or −Y direction) is set in the moving direction of reticle 2. There are light-transmitting portions (hereinafter referred to as "reticle windows") 5A, 5B, 5C, ... at pitch PR along the moving direction outside an edge located along the moving direction of original pattern area 3 on the reticle 2, and reticle marks 6A, 6B, 6C, ... of two-dimensional diffraction grating marks formed outside the respective reticle windows. Also, outside an edge on the opposite side of the said edge there are reticle windows 7A, 7B, 7C, ... formed as opposed to the reticle windows 5A, 5B, 5C, ... and reticle marks 8A, 8B, 8C, ... of two-dimensional diffraction grating marks formed outside the respective reticle windows 5A, 5B, 5C ....

In this case, letting D be the width of the illumination area 4 in the moving direction, the pitch PR of reticle marks 6A, 6B, 6C, ... (or reticle marks 8A, 8B, 8C, ...) is set not more than the width D. Namely, the following relation holds.

$$PR \leq D \tag{1}$$

A projection optical system 9 is located underneath the reticle 2. An optically transparent chromatic aberration control plate 10 is set on the pupil plane (Fourier transform plane) of projection optical system 9. Phase diffraction gratings 11A, 11B, 11C are formed for deflecting light for alignment (alignment light) on the chromatic aberration control plate 10. Though not shown, the chromatic aberration control plate 10 has twelve or ten diffraction gratings in total thereon. The projection optical system 9 is corrected in chromatic aberration for the exposure light, so that an axial chromatic aberration appears for the alignment light of a wavelength different from that of the exposure light. Therefore, the axial chromatic aberration is arranged to be corrected by the diffraction gratings (11A, ...) on the chromatic aberration control plate 10. Further, it can be contemplated that the diffraction gratings on the chromatic aberration control plate 10 are arranged to produce a predetermined horizontal shift (deviation) of the alignment light in order to set the wafer-mark-formed region at a selected region on the wafer.

An original pattern in the illumination area 4 on the reticle 2 is projected through the projection optical system 9 in a rectangular exposure area 17 on the wafer 12 coated with a photoresist to form an image demagnified for example at a reduction rate of ⅕ or ¼. Preliminary steps should have been executed to form a predetermined circuit pattern in each shot area 13A, 13B, 13C, ... on the wafer 12. The image of circuit pattern in the original pattern area 3 on the reticle 2 is projected onto each of the thus formed circuit patterns. In exposure by the slit scan exposure method, supposing the reticle 2 is moved at velocity V in the −Y direction relative to the illumination area 4, each shot area in the wafer 12 is moved at velocity βV in the Y direction relative to the exposure area 17 where β is a projection magnification of projection optical system 9. Through this sequential scan, the entire image of circuit pattern is projected onto the wafer 12.

For alignment on this occasion, each shot area in wafer 12 has wafer marks for alignment in a same arrangement. Taking a shot area 13B as an example, wafer marks 15A, 15B, 15C, ... of two-dimensional diffraction grating marks are formed at pitch PW in the moving direction and near an edge parallel to the moving direction of the shot area 13B. Also, near the other edge parallel to the moving direction of shot area 13B there are wafer marks 16A, 16B, 16C, ... of two-dimensional diffraction grating marks formed as opposed to the wafer marks 15A, 15B, 15C, ..., respectively.

In this case, using the projection magnification β of projection optical system 9 and the width D of illumination area 4 in the moving direction, the width of exposure area 17 on the wafer 12 in the moving direction (Y direction) can be expressed by β.D. Also, using the pitch PR of reticle marks on the reticle 2 in the moving direction, the pitch PW of wafer marks for the shot area 13B in the moving direction can be expressed by β.PR. Consequently, the following relation holds from formula (1).

$$PW \leq \beta.D \tag{2}$$

This means that the arrangement pitch W of wafer marks on each shot area in wafer 12 is smaller than the width of exposure area 17 in the moving direction. Therefore, one or more pairs of wafer marks (for example wafer marks 15A, 16A) are always formed within the range of the width of exposure area 17 in the moving direction. Then, alignment can be always made during exposure using the wafer marks.

An alignment system 18 of the TTR (through-the-reticle) method is set above the reticle 2. The alignment system in the present embodiment is a detection system of the double beam interference method and the heterodyne method, but FIG. 1 shows only one alignment light AL out of a plurality of laser beams for alignment.

In the alignment system 18, the alignment light AL emitted from a light supply system 19 passes through a beam splitter 20 and then is reflected by a galvano-mirror 21 to enter an alignment objective lens 23. The galvano-mirror 21 is so arranged as to be swung about a certain axis by a drive unit 22 (galvanometer scanner). Further, the alignment objective lens 23 is an fθ lens, and the galvano-mirror 21 is located approximately on the front focal plane (pupil plane) of the alignment objective lens 23.

The alignment light AL is converged by the alignment objective lens 23 and the converged alignment light AL is reflected by a bending mirror 24 to illuminate for example a reticle mark 6C and a reticle window 5C on the reticle 2. On this occasion the galvano-mirror 21 is pivoted to follow the Y-directional movement of the reticle mark 6C and reticle window 5C so that the alignment light always follows the reticle mark 6C and reticle widow 5C. If the reticle mark 6C and reticle window 5C reach the edge of the width of illumination area 4, the galvano-mirror 21 is largely swung so that the alignment light impinges on next reticle mark and reticle window. The use of fθ lens facilitates the control for deflecting the alignment light AL. Also, locating the galvano-mirror 21 on the pupil plane of alignment objective lens 23, the alignment light AL becomes incident into the reticle 2 on a telecentric basis.

The alignment light passing through the reticle window 5C enters the projection optical system 9 and is deflected by a diffraction grating on the chromatic aberration control plate 10 so as to illuminate a wafer mark 15C on the shot area 13B in wafer 12. The alignment light impinging upon the wafer mark 15C is diffracted thereby to become a plurality of diffraction beams emerging upward therefrom, returning through the projection optical system 9 and the diffraction gratings on the chromatic aberration control plate 10 again to the reticle window 5C. On the other hand, the alignment light impinging upon the reticle mark 6C becomes a plurality of diffraction beams emergent upward. The alignment light returning to the reticle window 5C and the alignment light returning upward from the reticle mark 6C travels by way of the bending mirror 24, the alignment objective lens 23 and the galvano-mirror 21 to reach the beam splitter 20. The alignment light reflected by the beam splitter 20 passes through a relay lens 25 to enter a partial reflection prism 26.

The alignment light returning from the reticle mark 6C passes through the partial reflection prism 26 to enter a photodetector 27 while the alignment light returning from the wafer mark 15C is reflected by the partial reflection prism 26 to enter a photodetector 28. The photodetector 27 outputs a reticle-side beat signal having a phase corresponding to a relative position between the reticle mark 6C and the radiated alignment light. The photodetector 28 outputs a wafer-side beat signal having a phase corresponding to a relative position between the wafer mark 15C and the radiated alignment light. An amount of relative positional deviation in the moving direction and the unmoving direction, is obtained between the reticle mark 6C and the wafer mark 15C from a phase difference between the reticle-side beat signal and the wafer-side beat signal. Similarly, positional deviation amounts are successively obtained for other reticle marks and corresponding wafer marks.

Since the present embodiment is so arranged that the light-receiving system (relay lens 25 to photodetectors 27, 28) is set on the light-supply system 19 side-with respect to the galvano-mirror 21, the size of a field stop (not shown) in the light-receiving system can be minimized and fixed, which is convenient in respect of arrangement.

It is noted that there are a bending mirror 29 located as opposed to the bending mirror 24 and another alignment system (not shown) located beside the bending mirror 29. Using this alignment system of the bending mirror 29, amounts of relative positional deviations are obtained between reticle marks 8A, 8B, 8C, ... on the reticle 2 and wafer marks 16A, 16B, 16C, ... near the shot area 13B in wafer 12. Accordingly, a positional deviation amount between the reticle 2 and the wafer 12 is always detected at each of two points thereon. Moving the reticle 2 and the wafer 12 so that these positional deviation amounts are kept within respectively predetermined permissible ranges, the registration accuracy can be maintained high between the pattern of reticle 2 and the circuit pattern on the shot area 13B in wafer 12.

The detection system and control system of the double beam interference method in the present embodiment are next described in detail with reference to FIG. 2 and FIG. 3.

Figure 2:
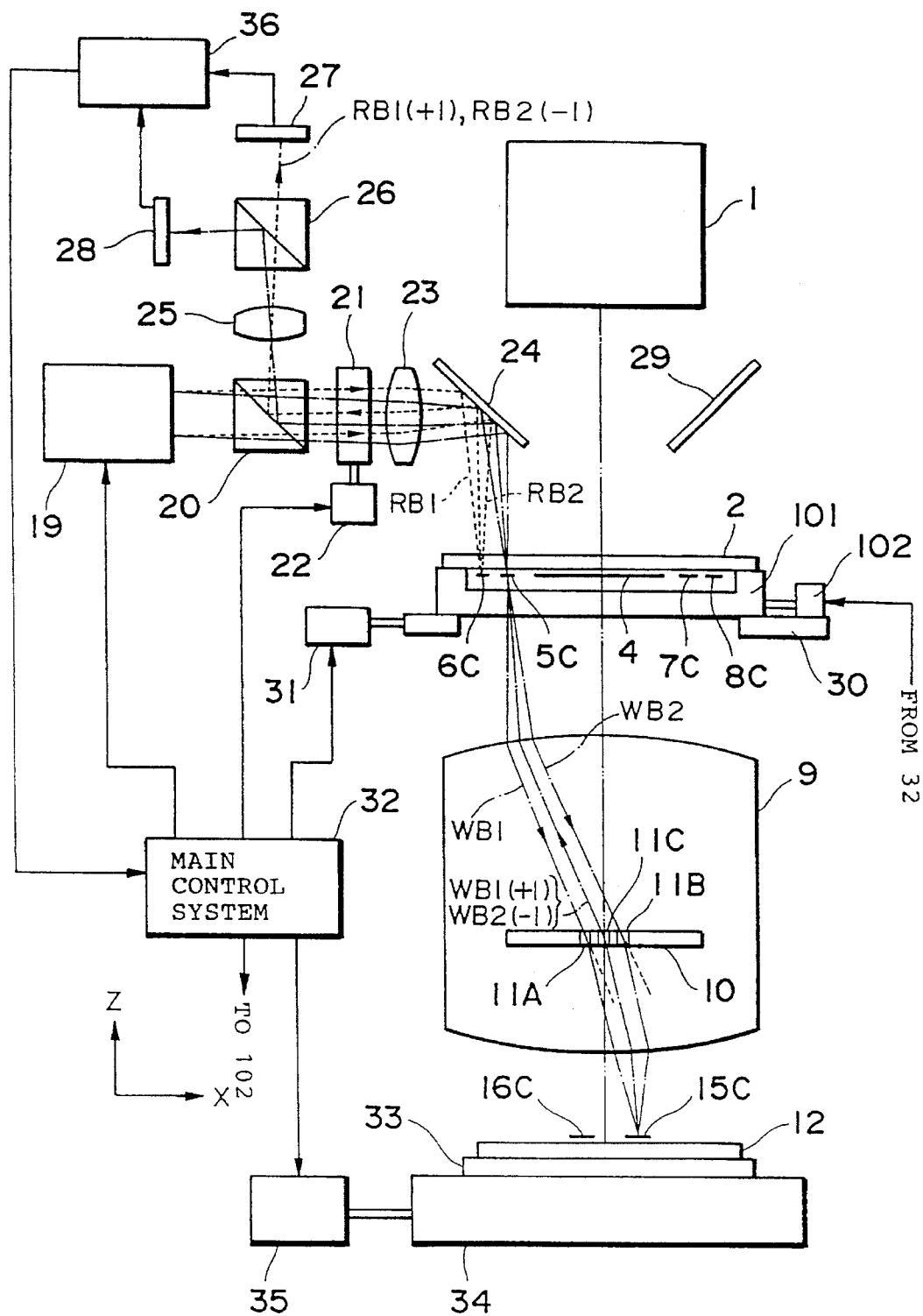
FIG. 2 is a side view to show the structure of an alignment system of a double beam interference method and a control system in the scanning exposure apparatus of FIG. 1.

FIG. 2 is a side view of a scanning exposure apparatus shown in FIG. 1. In FIG. 2, the reticle 2 is set on an X-Y stage 101 used mainly for correcting a positional deviation of the reticle 2, and the X-Y stage 101 is mounted on a reticle stage 30 together with a drive unit 102 thereof. The reticle stage 30 displaces the reticle 2 along the Y direction (the direction normal to the plane of FIG. 2) by a drive unit 31 during exposure. On this occasion, both the X-Y stage 101 and drive unit 102 also are displaced.

On the other hand, the wafer 12 is held on a wafer stage 34 through a wafer holder 33. The wafer stage 34 is mainly composed of a Z stage for positioning the wafer 12 along the optical axis of projection optical system 9 and an X-Y stage for positioning the wafer 12 in the X direction and in the Y direction perpendicular to the optical axis AX. In exposure the wafer stage 34 is driven by a drive unit 35 to displace the wafer 12 along the Y direction. On this occasion, a main control system 32 obtains a relative positional relation between the reticle 2 and the wafer 12 from measurement results in the alignment system, and controls operations of the drive units 31 and 35 so as to keep the positional relation within a designed range. In this case the main control system mainly adjusts the moving velocity of reticle 2 and the moving velocity of wafer 12.

In FIG. 2, the light supply system 19 in the alignment system emits reticle laser beams RB1, RB2 (as represented by the dashed lines in FIG. 2), which is two beams with a frequency difference $\Delta f$ (for example 50 kHz) therebetween, and wafer laser beams WB1, WB2. The laser beams are for example He-Ne laser beams (wavelength 633 nm) in the wavelength range to which the photoresist on the wafer 12 is not sensitive. Thus, the average wavelength $\lambda_2$ of the alignment light is different from the wavelength $\lambda_1$ of the exposure light in the present embodiment. The reticle laser beams RB1, RB2 are led by way of the beam splitter 20, the galvano-mirror 21, the alignment objective lens 23 and the bending mirror 24 to be focused for example on a reticle mark 6C on the reticle 2.

Figure 4A:
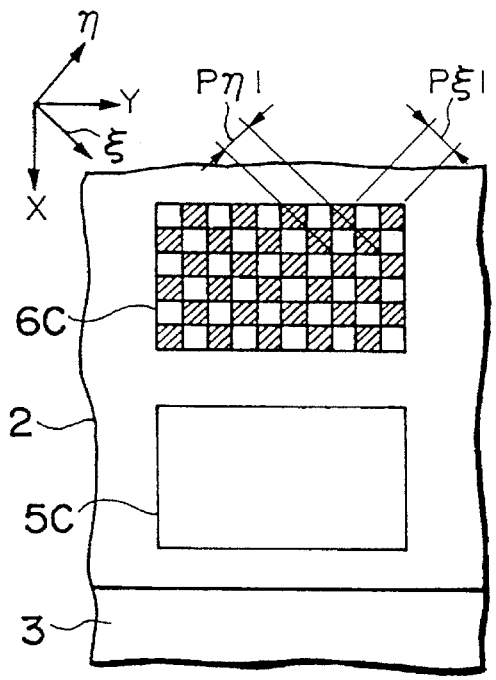
FIG. 4A is an enlarged plan view to show a reticle mark and a reticle window.

FIG. 4A shows an appearance near a reticle mark and a reticle window on the reticle 2. As shown in FIG. 4A, the reticle mark 6C on the reticle 2 is a checkered pattern in which reflecting portions are provided as hatched portions in a grid layout parallel to the X direction and the Y direction. In this case, taking the $\xi$ axis in a direction intersecting at 45° counterclockwise with the X axis and the $\eta$ axis in a direction perpendicular to the $\xi$ axis, the reticle mark 6C can be considered as a two-dimensional diffraction grating with the pitch $P\xi 1$ in the $\xi$ direction and the pitch $P\xi 1$ in the $\eta$ direction.

Figure 5:
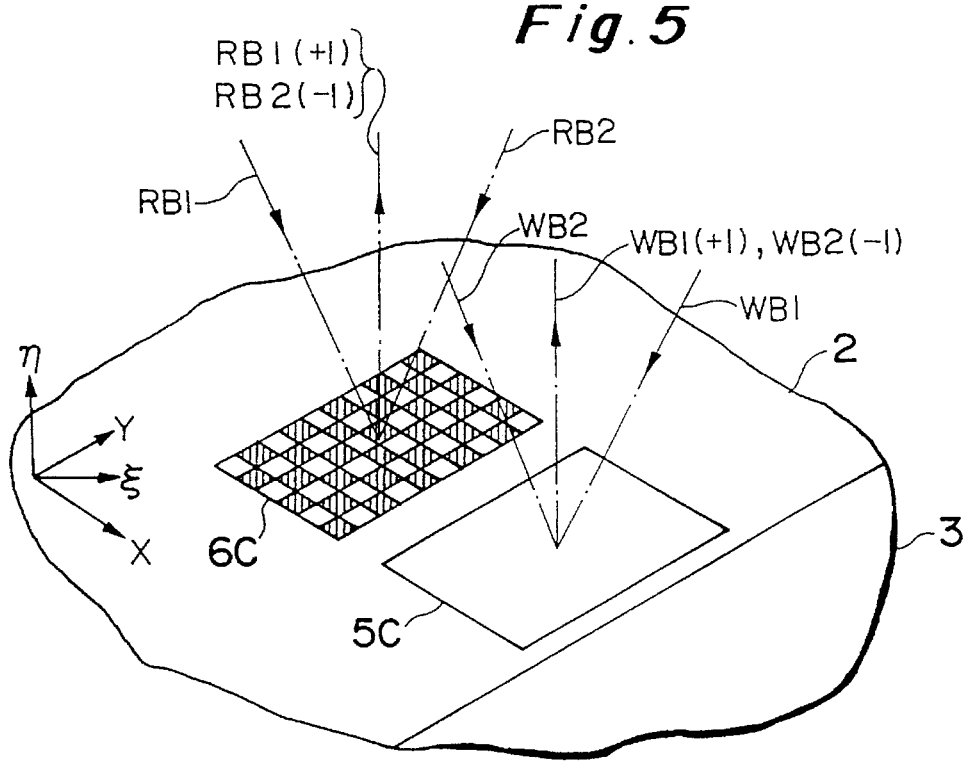
FIG. 5 is an enlarged perspective view to illustrate a case where position detection of reticle mark is executed by the double beam interference method.

FIG. 5 shows the reticle mark 6C and the reticle window 5C. As shown in FIG. 5, the reticle laser beams RB1, RB2 are incident at respective incident angles $-\theta_R, \theta_R$ in a plane parallel to the $\xi$ axis onto the reticle mark 6C. Since the grating pitch $P\xi 1$ of the reticle mark 6C in the $\xi$ direction satisfies the following formula, +first order diffraction light RB1(+1) of the laser beam RB1 and −first order diffraction light RB2(−1) of the laser beam RB2 is emergent vertically upward from the reticle mark 6C to return to the beam splitter 20 in FIG. 2.

$$\sin(\theta_R)=\lambda_2/P\xi 1 \qquad (3)$$

Although FIG. 5 shows only the two laser beams RB1, RB2 incident into the reticle mark 6C in the $\xi$ direction, laser beams for position detection in the $\eta$ direction are also irradiated in actual onto the reticle mark 6C in a plane parallel to the $\eta$ direction. Then, ±first order diffraction light of the two laser beams in the $\eta$ direction is also emergent in parallel with the ±first order diffraction light RB1 (+1), RB2 (−1). In this case, for example setting the frequency difference (beat frequency) between the two laser beams in the $\xi$ direction different from the frequency difference between the two laser beams in the $\eta$ direction, a band-pass filter circuit is used to separate a beat signal of interference light between the ±first order diffraction light in the $\xi$ direction from a beat signal of interference light between the ±first order diffraction light in the $\eta$ direction.

On the other hand, in FIG. 2, the wafer laser beams WB1, WB2 are led by way of the beam splitter 20, the galvano-mirror 21, the alignment objective lens 23 and the bending mirror 24 to reach a reticle window 5C on the reticle 2. The laser beams WB1, WB2 passing through the reticle window 5C then reach the chromatic aberration control plate 10 in the projection optical system 9. The laser beams WB1, WB2 are incident into respective diffraction gratings 11A and 11b on the chromatic aberration control plate 10, where the optical paths of the beams are bent by respectively determined angles. The laser beams WB1, WB2 are then incident at respective incident angles $-\theta_W$, $\theta_W$ onto a wafer mark 15C on the wafer 12.

Figure 4B:
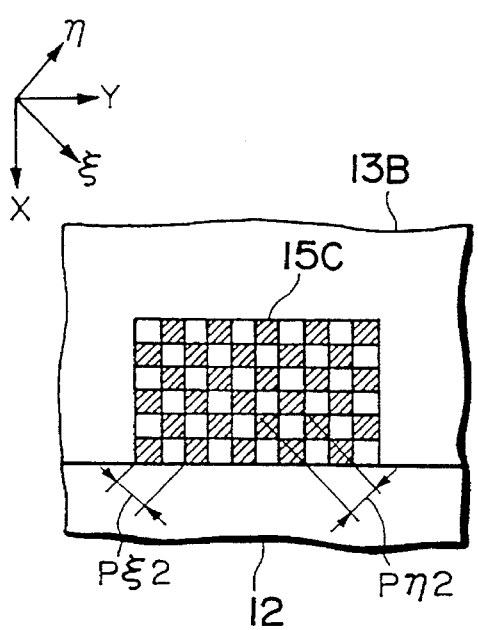
FIG. 4B is an enlarged plan view to show a wafer mark.

FIG. 4B shows the wafer mark 15C on the wafer 12. As shown in FIG. 4B, the wafer mark 15C is a checkered pattern in which reflecting portions are provided as hatched portions in a grid layout parallel to the X direction and Y direction. In this case, taking the ξ axis along a direction intersecting at 45° counterclockwise with the X axis and the η axis along a direction perpendicular to the ξ axis, the wafer mark 15C can be considered as a two-dimensional diffraction grating with the pitch Pξ2 in the ξ direction and the pitch Pη2 in the η direction. The two laser beams WB1, WB2 in FIG. 2 are incident onto the wafer mark 15C in a plane parallel to the ξ axis in FIG. 4B. Since the grating pitch Pξ2 of wafer mark 36 in the ξ direction satisfies the following formula, +first order diffraction light WB1(+1) of the laser beam WB1 and −first order diffraction light WB2(−1) of the laser beam WB2 is emergent vertically upward, as shown in FIG. 2, to become interference light changing its intensity at a predetermined beat frequency.

$$\sin(\theta_W) = \lambda_2 / P\xi 2 \qquad (4)$$

The ±first order diffraction light WB1(+1), WB2(−1) from the wafer mark 15C is deflected by the diffraction grating 11C on the chromatic aberration control plate 10. Then the ±first order diffraction light is outgoing from the projection optical system 9 to return to the reticle window 5C. Also, similarly as in the case of reticle 2, laser beams for position detection in the η direction are actually incident onto the wafer mark 15C in a plane parallel to the η direction. Then, ±first order diffraction light of the two laser beams in the η direction are also emergent in parallel with the ±first order diffraction light WB1 (+1), WB2 (−1). Also in this case, a beat signal of interference light between the ±first order diffraction light in the η direction can be readily separated for example by frequency discrimination from a beat signal of interference light between the ±first order diffraction light in the η direction.

Returning to FIG. 2, the ±first order diffraction light RB1(+1), RB2(−1) from the reticle mark 6C and the ±first order diffraction light RB1(+1), RB2(−1) from the wafer mark 15C is guided by way of the bending mirror 24, the alignment objective lens 23, the galvano-mirror 21, the beam splitter 20 and the relay lens 25 then to enter the partial reflection prism 26. Then the ±first order diffraction light RB1 (+1), RB2 (−1) from the reticle mark 6C is subjected to photoelectric conversion in the photodetector 27 while the ±first order diffraction light RB1(+1), RB2(−1) from the wafer mark 15C to photoelectric conversion in the photodetector 28. Photoelectrically converted signals (beat signals) from the photodetectors 27 and 28 are supplied to a signal processing circuit 36. The signal processing circuit 36 obtains amounts of relative positional deviations in the ξ direction and in the η direction between the reticle mark 6C in FIG. 4A and the wafer mark 15C in FIG. 4B, and supplies the information about the positional deviation amounts to the main control system 32. The main control system 32 controls the drive of drive unit 102 based on the information about positional deviation amounts to move the X-Y stage 101 so as to correct the setting position of reticle 2.

Figure 3:
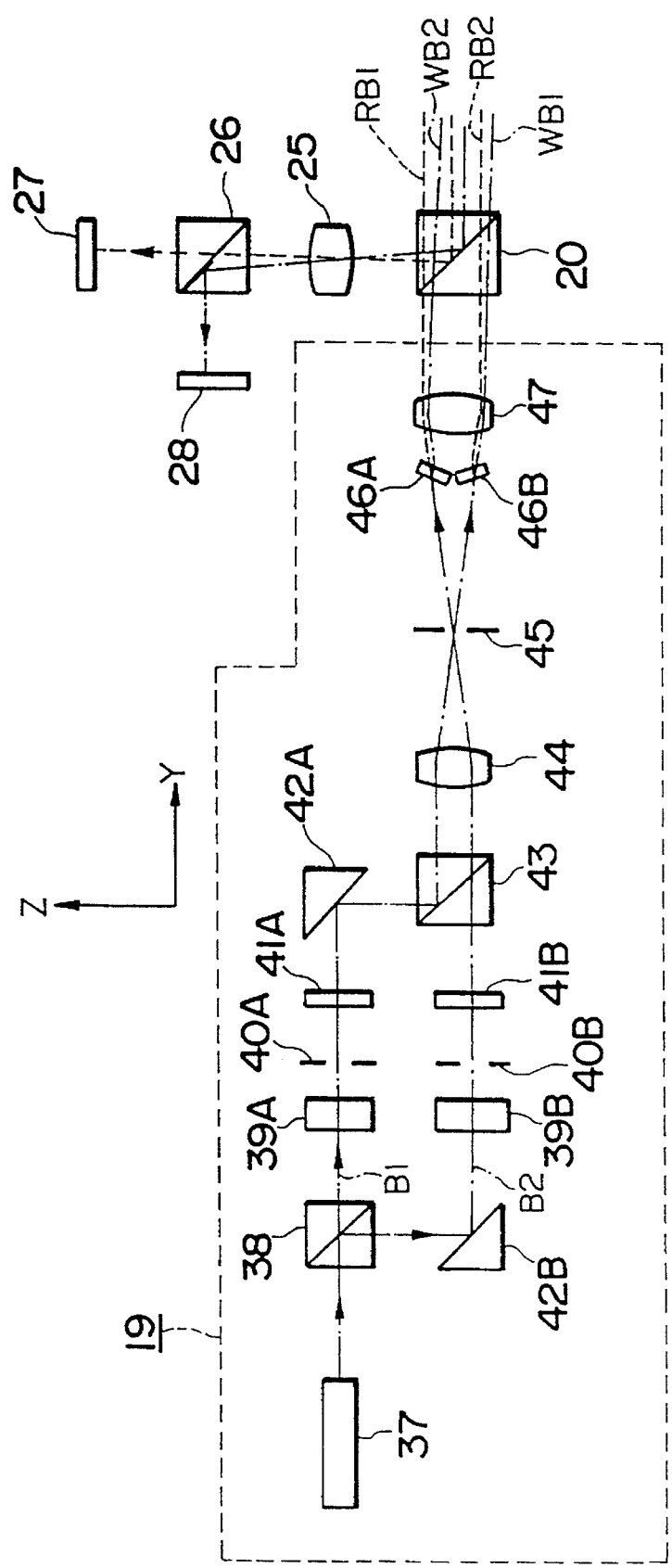
FIG. 3 is a block diagram to show the structure of a light supply system and a light-receiving system in the alignment system of FIG. 2.

Here, FIG. 3 shows the light supply system 19 in the alignment system in FIG. 2. In FIG. 3, the laser beam emitted from the laser light source 37 is split into two beams by a beam splitter 38. One beam B1 enters an acousto-optic modulator (hereinafter referred to as "AOM") 39A while the other beam B2 is reflected by a reflecting prism 42B then to enter AOM 39B.

The AOMs 39A and 39B are driven at respective frequencies $F_1$ and $F_2$. Among various order laser beams diffracted by the AOMs 39A and 39B, slits 40A and 40B each select only +first order diffraction light. When the laser beams entering the AOMs 39A and 39B have a frequency $f_0$, the laser beams outgoing therefrom have frequencies $f_1$ and $f_2$ higher by drive frequencies $F_1$ and $F_2$ of AOMs 39A and 39B, respectively, than the frequency $f_0$.

The laser beam B1 passes through a plane-parallel glass 41A for adjusting the optical path and a reflecting prism 42A then to enter a synthesizing prism 43, while the other laser beam B2 passes through a plane-parallel glass 41B for adjusting the optical path then to enter the synthesizing prism 43. Then the laser beams B1, B2, optical paths of which are made in parallel by the synthesizing prism 43, are focused by a lens 44 on a field slit 45 located at a position conjugate with the reticle and the wafer. Located behind the field slit 45 are two plane-parallel plates 46A, 46B entrance planes of which are half mirrors of vapor-deposited thin film. Then the laser beams B2 and B1 outgoing from the aperture in the field slit 23 are split into laser beams RB1, WB2 and laser beams RB2, WB1 by the plane-parallel plates 46A and 46B, respectively.

The reticle laser beams RB1, RB2 and the wafer laser beams WB1, WB2 are guided through a relay lens 47 to be outgoing from the light supply system 19, and thereafter advance through the beam splitter 20 toward the galvano-mirror 21 (see FIG. 2). FIG. 3 shows the light supply system 19 for producing the beams parallel to the ξ direction in FIG. 4, and another light supply system is provided in parallel with the light supply system 19 such that the another system is rotated 90° relative to the light supply system 19 in FIG. 3 and has AOMs 39A and 39B driven at modified drive frequencies.

Next described is the overall operation in exposure by the slit scan exposure method in the present embodiment.

First in FIG. 1, the reticle 2 starts being moved in the −Y direction while the shot area 13B in wafer 12 starts being moved in the Y direction. When the moving velocity of reticle 2 reaches a constant velocity V, the moving velocity of wafer 12 reaches β·V. After that, when the illumination area 4 is about to overlap with an edge of pattern area 3, the galvano-mirror 21 is swung to change the irradiation positions of the laser beams. Then, searching a position where the amplitude of beat signal obtained in the photodetector 27 becomes maximum, the alignment light AL including a plurality of laser beams is made to impinge upon the reticle mark 6A. On this occasion coarse alignment is carried out so that the intensity of interference light composed of diffraction beams from the wafer mark 15A in the shot area 13B becomes maximum.

Then obtained from beat signals output from the photodetectors 27 and 28 are amounts of relative positional deviation in the X direction and in the Y direction between the reticle mark 6A and the wafer mark 15A. The positional deviation amounts in the X direction and in the Y direction are obtained from positional deviation amounts in the ξ direction and in the ι direction in FIG. 4. Similarly, through an unrepresented alignment system, positional deviation amounts are also obtained between the reticle mark 8A and the wafer mark 16A. The alignment light AL is scanned by the galvano-mirror 21 so as to follow the movement of reticle 2 and wafer 12, whereby positional deviation amounts are continuously detected between the reticle mark 6A and the wafer mark 15A and between the reticle mark 8A and the wafer mark 16A. Then the main control system 32 in FIG. 2 adjusts positions of the reticle stage 30 and the wafer stage 34 through the drive units 31, 35 and 102 so that the positional deviation amounts of the two sets of alignment marks are kept within a predetermined permissible range.

After that, when a next reticle mark 6B comes into the width of illumination area 4 on the reticle 2, that is, when the intensity of diffraction light from the wafer mark 15A becomes lower, the galvano-mirror 21 is swung in the opposite direction to make the reticle alignment light emergent from the light supply system 19 in the alignment system impinge upon the next reticle mark 6B. On this occasion, the wafer alignment light emergent from the light supply system 19 is made to impinge on a next wafer mark 15B for the shot area 13B. By this, alignment is carried out between the reticle mark 6B and the wafer mark 15B in parallel with alignment between the reticle mark 8B and the wafer mark 16B. Similarly, alignment is successively executed using the reticle marks 6C, ... and 8C, ....

Figure 6:
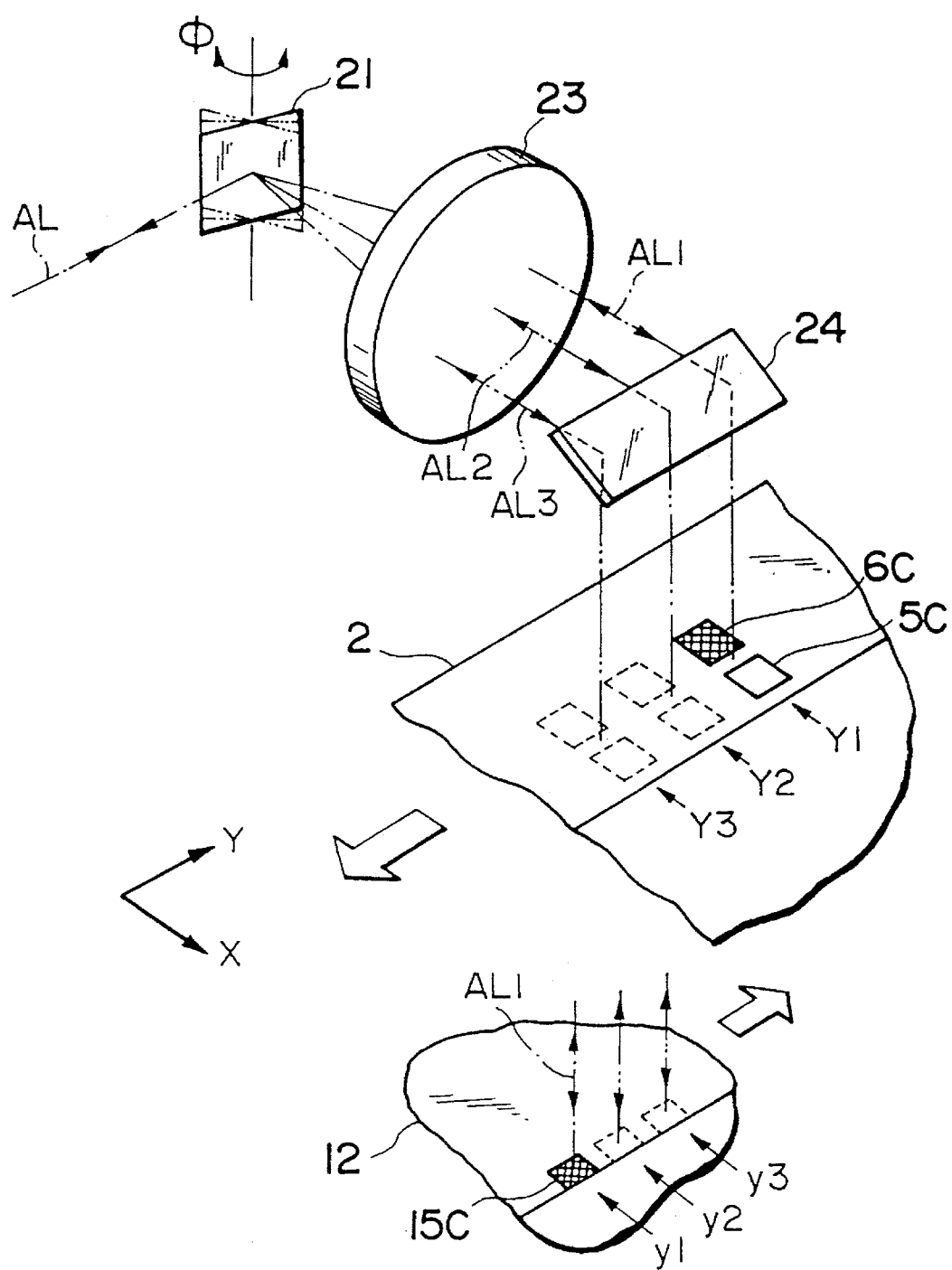
FIG. 6 is a perspective view of the main part to show a case where a galvano-mirror is used for alignment light to follow the reticle mark and the wafer mark.

Taking the reticle mark 6C and the wafer mark 15C as an example, a method for following the moving marks is described referring to FIG. 6. In FIG. 6, in case the reticle mark 6C on the reticle 2 is located at a position Y1 in the Y direction and the wafer mark 15C on the wafer 12 is at a position y1 in the Y direction, the alignment light AL reflected by the galvano-mirror 21 is made to impinge upon the reticle mark 6C and the wafer mark 15C. Then, when with movement of the reticle 2 and wafer 12 the reticle mark 6C moves to a position Y2 and the wafer mark 15C to a position y2, the galvano-mirror 21 is rotated in the Φ direction so that the alignment light AL reflected by the galvano-mirror 21 follows the reticle mark 6C and the wafer mark 15C.

Further, when the reticle mark 6C is moved to a position Y3 and the wafer mark 15C is moved to a position y3, the galvano-mirror 21 is largely rotated in the Φ direction so that the alignment light AL reflected by the galvano-mirror 21 may follow the reticle mark 6C and the wafer mark 15C.

In this case, the alignment objective lens 23 is an fθ lens, the galvano-mirror 21 is located on the front focal plane of objective lens 23, and the reticle 2 and wafer 12 are displaced at substantially constant velocities. Therefore, in synchronization with the uniform motion of the reticle mark and the wafer mark, the galvano-mirror 21 is rotated at a uniform angular velocity to scan the laser beam. Letting ω be an angular velocity and t be a time, the rotational angle Φ can be expressed by tω. When the reticle mark and the wafer mark are deviated out of the width along the moving direction, of the slit illumination area 4 (see FIG. 1), the galvano-mirror 21 is swung in the opposite direction to follow next reticle mark and wafer mark. Accordingly, the rotational angle of galvano-mirror 21 changes with a sawtooth characteristic. Also, if there are variations in pitch of reticle mark and in pitch of wafer mark, the rotational angle of galvano-mirror is adjusted so that the intensity of signals from the marks becomes maximum.

In case pulse light (for example excimer laser light) being used as the exposure light, a blank period of alignment can be made substantially zero by carrying out the operation to swing the polygon mirror 21 in the opposite direction for next marks within a time between pulse emissions.

As described above, the present embodiment is so arranged that the reticle marks and wafer mark both are simultaneously detected, whereby the position detection can be accurately made even with slight variations in relative velocity between the reticle 2 and the wafer 12. Since a difference in relative velocity is very small between the alignment light AL and the reticle mark or wafer mark, a frequency of obtained beat signal is approximately constant, whereby the position detection can be accurately performed.

For example, in case the reticle 2 is moved in the Y direction and the wafer 12 in the −Y direction in FIG. 1, the pivoting direction of galvano-mirror 21 is simply reversed. The same processing method in the alignment system can be employed, because the frequency of obtained beat signal is approximately constant independent of the moving directions of reticle 2 and wafer 12.

Now consider a specific example in which in FIG. 1 the width of shot area 13B in wafer 12 in the moving direction (Y direction) is 40 mm and the width of shot area 13B in the non-moving direction (X direction) is 30 mm. Assuming that the width of the exposure region 17, which is a conjugate image of the slit illumination area 4, in the moving direction is 10 mm, that the moving velocity of wafer 12 is 100 mm/sec, and that the projection magnification β of projection optical system 9 is ¼, the maximum pitch PW of wafer marks 15A, 15B, 15C, ... is 10 mm. In this case, since the width of shot area 13B in the moving direction is 40 mm, four wafer marks on each side, eight wafer marks in total, should be formed along the moving direction in the effective exposure area of shot area 13B. Similarly, near the pattern area 3 of reticle 2, four reticle marks on each side, eight reticle marks in total, should be formed along the moving direction.

Since the moving velocity of wafer 12 is 100 mm/sec and the wafer marks are aligned at the pitch of 10 mm, the frequency of galvano-mirror 21 is 10 Hz. A normal galvanometer scanner can follow a frequency over several hundred Hz. Therefore, the galvano-mirror 21 in the present embodiment can easily follow the reticle marks and wafer marks.

Figure 9:
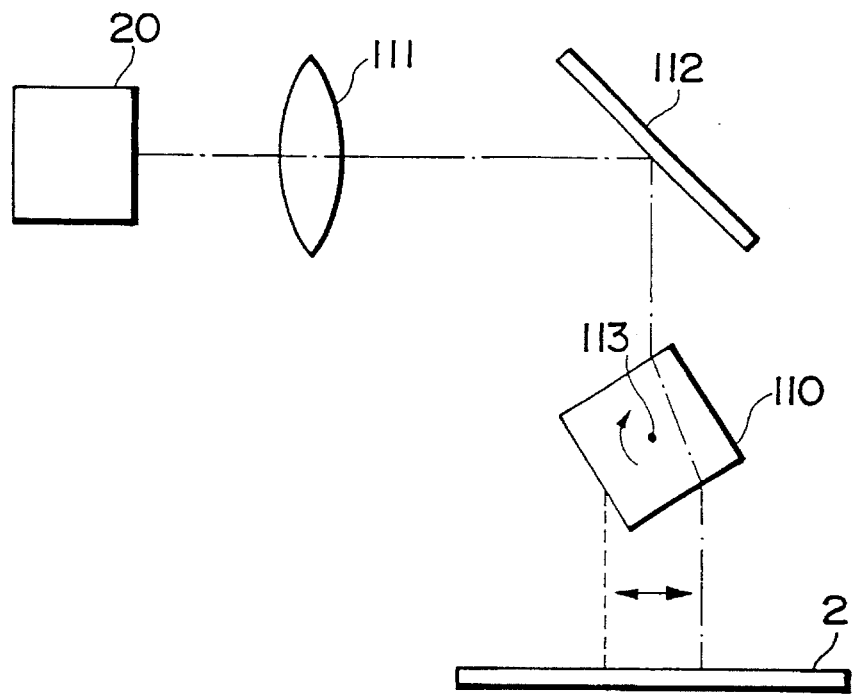
FIG. 9 is a schematic diagram to show another structural example of scanning optical system.
Figure 10:
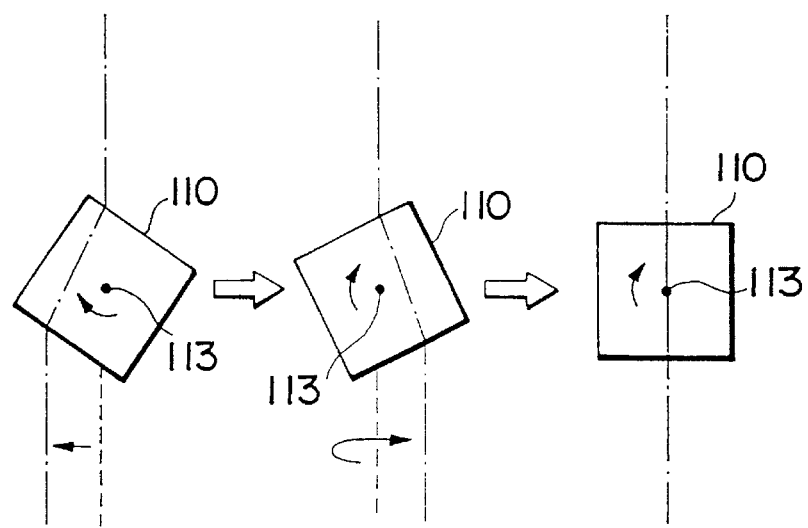
FIG. 10 is an explanatory drawing to show a scanning state of the example in FIG. 9.

The above-described embodiment illustrated the galvanometer scanner employed as the scanning optical system for scanning the optical beams emitted from the light supply system 19, but besides this, the scanning optical system can be constructed using a square-pillar prism 110 as shown in FIG. 9. The scanning optical system is constructed such that an objective lens 111, a reflecting mirror 112 and a square-pillar prism 110 are arranged in order on the exit side of the beam splitter 20 in FIG. 2. The square-pillar prism 110 is so arranged that its barycentric axis 113 is located on the optical axis of an optical beam, so that the optical beam can be scanned by rotating the square-pillar prism 110 about the barycentric axis 113 (see FIG. 10).

Figure 11:
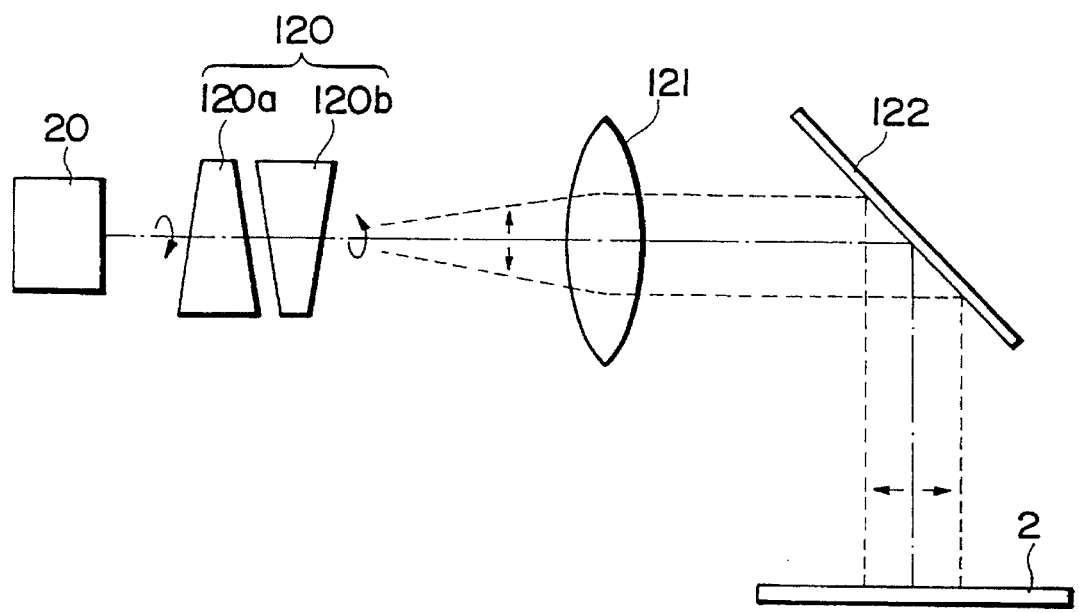
FIG. 11 is a schematic diagram to show another structural example of scanning optical system.
Figure 12:
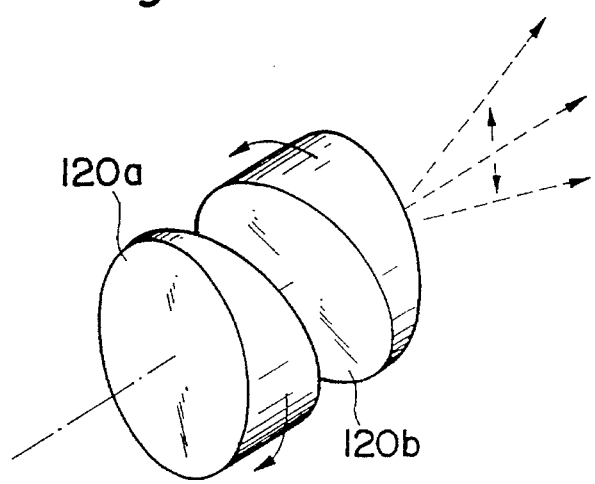
FIG. 12 is an explanatory drawing to show a scanning state of the example in FIG. 11.

The scanning optical system may be constructed as shown in FIG. 11. In an example of FIG. 11, the optical system is constructed of a D-prism 120, an objective lens 121 and a reflecting mirror 122 arranged in order on the exit side of the beam splitter 20 in FIG. 2. The D-prism 120 is composed of a combination of two wedge-shaped prisms 120a, 120b, as located in the vicinity of the stop of objective lens 121. To scan a light beam, the prism 120a and the prism 120b are rotated in mutually opposite directions about the optical axis of the light beam. This operation can scan the optical beam along a direction. In this case, letting f be a focal length of objective lens 121 and θ be a deflecting angle of D-prism (declimation prism) 120, a deflection amount of light beam is expressed by f.θ.

In the structure of FIG. 2 the galvano-mirror 21 may be replaced by a rotary polygon mirror.

Further, the alignment objective lens 23 in FIG. 1 may be arranged to move in the scanning direction to follow the marks.

Figure 7:
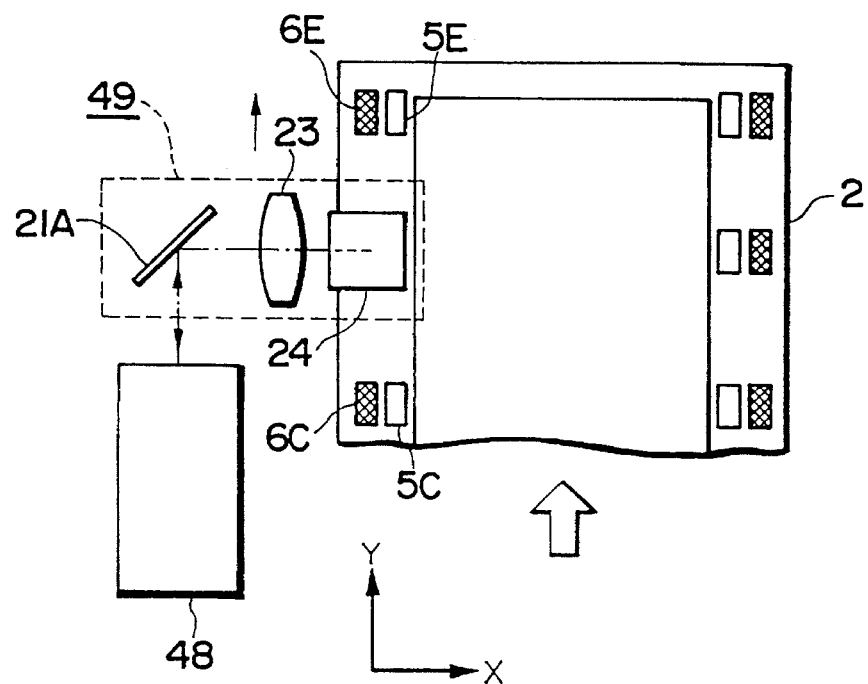
FIG. 7 is a plan view to show the main part of an example in which an alignment objective lens is moved to follow the reticle mark.

FIG. 7 shows the main part of a structure for moving the alignment objective lens. In FIG. 7, an alignment system 48 is an optical system of from the light supply system 19, the beam splitter 20 and the relay lens 25 to the photodetectors 27, 28 in FIG. 1. Alignment light from the alignment system 48 is reflected by a mirror 21A and thereafter is converged by an alignment objective lens 23 to be reflected by a bending mirror 24 and then to impinge on a reticle mark and a reticle window on the reticle 2. The mirror 21A, the alignment objective lens 23 and the bending mirror 24 are incorporated and fixed in a moving mechanism 49, and the moving mechanism 49 is arranged to be movable in the Y direction, which is the moving direction of reticle 2.

In exposure by the slit scan exposure method, the reticle 2 is moved in the Y direction to move the reticle marks and reticle windows in the Y direction and the moving mechanism 49 is also moved in the Y direction to follow the reticle marks and the reticle windows, whereby a positional deviation amount is always detected between a reticle mark and a wafer mark.

Figure 8A:
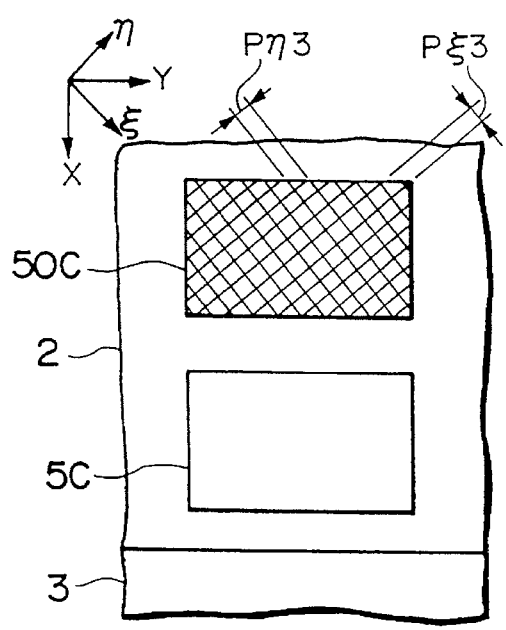
FIG. 8A is an enlarged plan view to show another example of reticle mark and reticle window.
Figure 8B:
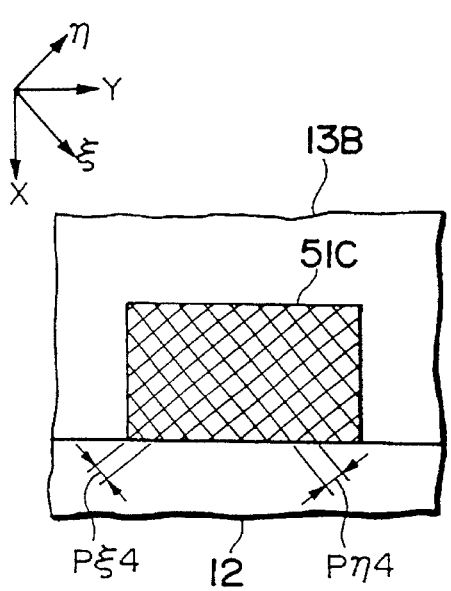
FIG. 8B is an enlarged plan view to show another example of wafer mark.

The above-described embodiment employed the checkered reticle marks and wafer marks as shown in FIGS. 4A and 4B. However, the reticle marks may be replaced by a two-dimensional diffraction grating pattern 50C as shown in FIG. 8A, which includes fine patterns parallel to the ξ direction intersecting at 45° with the Y direction as the moving direction and fine patterns parallel to the η direction perpendicular to the ξ direction. Similarly, the wafer marks in FIG. 4 may be replaced by a two-dimensional diffraction grating pattern 51C as shown in FIG. 8B, which includes fine groove patterns parallel to the ξ direction and fine groove patterns parallel to the η direction. Especially, in order to reduce the influence of asymmetry of wafer marks by making the mark grooves thinner in the wafer marks, the wafer mark 51C of FIG. 8B is naturally preferred to be used.

It is of course that the present invention is not limited to the above-described embodiments but can have various applications within the scope not departing from the essence of the present invention.

In the scanning exposure apparatus as so arranged, the light for position detection is scanned so as to follow the movement of marks for alignment, which brings about such an advantage that without increasing the alignment mark region the position detection can be carried out over a wider region along the running area of mask or substrate than the alignment mark region. Another advantage is that because the relative velocity is almost zero between the alignment marks and the alignment light a beat signal obtained in the use of the heterodyne method is not frequency-modulated. Consequently, the signal processing is easy.

Also, adjusting at least one of the moving velocity of mask and the moving velocity of substrate stage so that a positional deviation amount between an alignment mark on mask and an alignment mark on substrate is kept within a predetermined permissible range, the registration accuracy between the mask and the substrate can be maintained high in a wide region.

In the case where the alignment marks formed on at least one of the mask and the substrate are a plurality of mark elements aligned along a direction to scan the illumination area of a predetermined shape and if the pitch of the mark elements in the moving direction is set smaller than the width of the illumination area of the predetermined shape in the moving direction, position detection of the mark elements can be continuously executed over the entire region in the moving direction.

In the case where a mask pattern is projected onto a substrate through a projection optical system composed of refracting systems, a ratio between the width of slit exposure area in the moving direction by the projection optical system and the width of shot area on the substrate in the moving direction is for example about 1:3 to 1:4. Therefore, the width of exposure area in the moving direction is considerably wider than that in case of a projection optical system including a reflecting system. Then, when the alignment marks are formed on a substrate at a pitch smaller than the width of exposure area, the area of the alignment mark region can be made smaller.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A scanning exposure apparatus for continuously transferring segments of an original pattern formed on a photomask onto a photosensitive substrate to transfer an image of the entire original pattern onto said photosensitive substrate, comprising:

a mask stage for moving said photomask in a predetermined direction;

a substrate stage for moving said photosensitive substrate in a direction along the moving direction of said mask stage in synchronization with movement of said mask stage;

driving means for driving said mask stage and substrate stage;

a light supply system for emitting light beams for detecting a relative positional relation between said mask stage and said substrate stage;

scanning means for scanning said light beams emitted from said light supply system along the movement direction of the mask stage so as to follow the moving mask stage; and a light-receiving system for detecting reflected light of the light beams emitted from said light supply system.

2. A scanning exposure apparatus according to claim 1, wherein said scanning means makes said light beams incident always at constant incident angles relative to a reference plane of said mask stage on which said photomask is to be set.

3. A scanning exposure apparatus according to claim 2, wherein said scanning means comprises a galvanometer scanner equipped with a plane reflecting mirror for reflecting said light beams, and an fθ lens, said galvanometer scanner being located on an entrance pupil plane of said fθ lens.

4. A scanning exposure apparatus according to claim 2, wherein said scanning means comprises a square-pillar prism having a square cross section as cut along a direction in which said light beams pass therethrough, said square-pillar prism being arranged to rotate about a barycentric axis thereof.

5. A scanning exposure apparatus according to claim 2, wherein said scanning means comprises a D-prism equipped with two wedge-shaped prisms, said wedge-shaped prisms constituting said D-prism being arranged to rotate in mutually opposite directions about the optical axis of said light beams.

6. A scanning exposure apparatus according to claim 2, further comprising a projection optical system for projecting the image of said original pattern at a predetermined projection magnification onto said substrate stage, between said mask stage and said substrate stage.

7. A scanning exposure apparatus according to claim 6, wherein said substrate stage is moved by said driving means in a direction opposite to the moving direction of said mask stage.

8. A scanning exposure apparatus according to claim 7, wherein said substrate stage is moved at a moving velocity $\beta V$ where $\beta$ is the projection magnification of said projection optical system and V is a moving velocity of said mask stage.

9. A scanning exposure apparatus according to claim 2, wherein said light beams emitted from said light supply system comprise:

a first light beam pair incident into said reference plane of said mask stage, as inclined in symmetry with respect to the moving direction of the mask stage; and a second light beam pair incident into a reference plane of said substrate stage on which said photosensitive substrate is to be set, as inclined in symmetry with respect to the moving direction of the substrate stage.

10. A scanning exposure apparatus according to claim 9, wherein said light supply system comprises frequency modulating means for providing a predetermined frequency difference between two light beams in each of said light beam pairs.

11. A scanning exposure apparatus according to claim 10, wherein said photomask comprises a first optical grating mark for detecting a position where the photomask is set;

wherein said photosensitive substrate comprises a second optical grating mark for detecting a position where the photosensitive substrate is set; and wherein said scanning means scans said first light beam pair as to follow said moving first optical grating mark and scans said second optical beam pair as to follow said moving second optical grating mark.

12. A scanning exposure apparatus according to claim 11, wherein said light-receiving system comprises:

first detecting means for receiving first interference light to convert it into an electric signal and outputting a first alternate current signal having a frequency according to said frequency difference and the moving velocity of said mask stage; and second detecting means for receiving second interference light to convert it into an electric signal and outputting a second alternate current signal having a frequency according to said frequency difference and the moving velocity of said substrate stage;

wherein said first interference light is formed by two diffraction beams emergent from the first optical grating mark in a same direction when said first light beam pair is irradiated onto the first optical grating mark;

wherein said second interference light is formed by two diffraction beams emergent from the second optical grating mark in a same direction when said second light beam pair is irradiated onto the second optical grating mark; and said light-receiving system further comprises positional deviation detecting means for detecting a relative positional deviation between said moving mask stage and substrate stage by comparing said first alternate current signal with said second alternate current signal.

13. A scanning exposure apparatus according to claim 12, further comprising displacing means for displacing at least one of said mask stage and said substrate stage so that an amount of a positional deviation detected by said positional deviation detecting means is kept within a predetermined permissible range.

14. A scanning exposure apparatus according to claim 13, wherein said first optical grating mark comprises a plurality of grating marks aligned at a predetermined pitch along the moving direction of said photomask thereon;

wherein said second optical grating mark comprises a plurality of grating marks aligned at a predetermined pitch along the moving direction of said photosensitive substrate thereon; and wherein the following relations are satisfied:

$$a_M \geq P_M \text{ and } a_W \geq P_W;$$

where $a_M$ is a width in a scanning direction, of an illumination area on said photomask formed by exposure light;

$a_W$ is a width in the scanning direction, of an illumination area on said photosensitive substrate corresponding to the illumination area on said photomask; and $P_M$ is a pitch of adjacent first optical grating marks and $P_W$ a pitch of adjacent second optical grating marks.

15. A scanning exposure apparatus according to claim 14, wherein said grating marks comprised said first optical grating mask are arranged on the both sides on said photomask and along the moving direction of said photomask; and wherein said grating marks comerised said second optical grating mask are arranged on the both sides on the photosensitive substrate and along the moving direction of said photosensitive substrate.

16. A scanning exposure apparatus according to claim 15, which comprises two sets of control systems, each control system comprising said light supply system, said scanning means, said frequency modulating means, said first and second detecting means, said positional deviation detecting means and said displacing means, corresponding to said first and second optical grating marks arranged on the both sides of said photomask and said photosensitive substrate.

17. A scanning exposure apparatus comprising:

a substrate stage for moving a photosensitive substrate in a direction along a moving direction of a mask stage for moving a photomask in synchronization with movement of said mask stage;

a light supply system for emitting light beams for detecting a relative positional relation between said mask stage and said substrate stage; and scanning means for scanning said light beams emitted from said light supply system along the movement direction of the mask stage so as to follow the moving mask stage.

* * * * *